(12) United States Patent
    Fjelstad

(10) Patent No.: US 10,517,174 B1
(45) Date of Patent: Dec. 24, 2019

(54) SOLDER ALLOY FREE ELECTRONIC (SAFE) RIGID-FLEXIBLE/STRETCHABLE CIRCUIT ASSEMBLIES HAVING INTEGRAL, CONDUCTIVE AND HEAT SPREADING SECTIONS AND METHODS FOR THEIR MANUFACTURE

(71) Applicant: Joseph Charles Fjelstad, North Bend, WA (US)

(72) Inventor: Joseph Charles Fjelstad, North Bend, WA (US)

(*) Notice: Subject to any disclaimer, the term of this patent is extended or adjusted under 35 U.S.C. 154(b) by 0 days.

(21) Appl. No.: 16/400,695

(22) Filed: May 1, 2019

(51) Int. Cl.
    *H05K 1/02* (2006.01)
    *H05K 1/14* (2006.01)
    *H05K 1/09* (2006.01)
    *H05K 3/46* (2006.01)
    *H05K 1/11* (2006.01)

(52) U.S. Cl.
    CPC .......... *H05K 1/147* (2013.01); *H05K 1/0201* (2013.01); *H05K 1/09* (2013.01); *H05K 1/115* (2013.01); *H05K 3/4691* (2013.01); *H05K 2201/06* (2013.01); *H05K 2201/09545* (2013.01)

(58) Field of Classification Search
    CPC ....................................................... H05K 1/02

USPC ......................................................... 174/252
See application file for complete search history.

(56) References Cited

U.S. PATENT DOCUMENTS

| | | | | |
|---|---|---|---|---|
| 5,629,838 A | * | 5/1997 | Knight | G01R 31/3025 361/782 |
| 7,161,239 B2 | * | 1/2007 | Zhao | H01L 23/24 257/706 |
| 2004/0195701 A1 | * | 10/2004 | Attarwala | H01L 21/4846 257/783 |
| 2005/0141150 A1 | * | 6/2005 | Bentley | C23C 18/1608 361/2 |
| 2006/0035510 A1 | * | 2/2006 | Numata | G02B 6/43 439/372 |
| 2012/0058653 A1 | * | 3/2012 | Rathburn | G01R 1/0491 439/76.1 |
| 2012/0061846 A1 | * | 3/2012 | Rathburn | H01L 21/4867 257/773 |

* cited by examiner

Primary Examiner — Stanley Tso

(57) ABSTRACT

A rigid flex circuit comprised of high thermal conductivity sections, said sections having components disposed so as to have their contacts substantially planar with the surface of the thermally conductive section and wherein the contacts are interconnected directly to the traces without the use of solder and further having the thermally conductive sections interconnected to one another by means of flexible circuit sections.

4 Claims, 21 Drawing Sheets

| Design PCB Assembly | Fabricate PCB (multilayer) | Assemble PCB |
|---|---|---|
| 1. Create schematic | 1. Verify RoHS compliance | 1. Procure components |
| 2. Indentify components | 2. Cut core laminas to size & tool | 2. Verify RoHS compliance |
| 3. Layout circuits | 3. Clean and coat with resist | 3. Verify component solderability |
| 4. Validate signal integrity | 4. Image and develop resist | 4. Verify component MSL number |
| 5. Validate design DfM | 5. Etch and strip resist | 5. Kit components |
| 6. Validate design DfR | 6. Treat exposed copper | 6. Procure PCBs |
| 7. Validate design DfE | 7. AOI or visual inspect layers | 7. Verify RoHS compliance |
| | 8. Cut B-stage to size and tool | 8. Verify PCB solderability |
| | 9. Lay up core and B-stage | 9. Verify PCB High Temp capability |
| | 10. Laminate | 10. Design solder stencil & purchase |
| | 11. X-ray inspect (optional) | 11. Develop suitable reflow profile |
| | 12. Create holes | 12. Track component exposure (MSL) |
| | 13. Desmear or etchback | (Rebake components as required) |
| | 14. Sensitize holes | 13. Position PCB & stencil solder paste |
| | 15. Plate electroless copper | (monitor solder paste) |
| | 16. Clean and coat with resist | 14. Inspect solder paste results |
| | 17. Image an develop resist | (height and skips) |
| | 18. Pattern plate copper | 15. Dispense glue dots (optional) |
| | 19. Pattern plate metal resist | 16. Place components |
| | 20. Strip plating resist | 17. Inspect for missing parts |
| | 21. Etch base copper | 18. Reflow solder |
| | 22. Clean and coat with soldermask | 19. Repeat Steps 13-18 if two sided assy |
| | 23. Image and develop | (second set of fixtures required) |
| | 24. Repeat as needed | 20. Perform hand assembly as required |
| | 25. Treat exposed metal | (odd sized or temperature sensitive) |
| | 26. Route to shape | 21. Clean flux from surface and under |
| | 27. Package | Verify low standoff devices |
| | 28. Ship | 22. Test cleanliness |
| | | 23. Underfill critical components |
| | | 24. X-ray inspect soldered assembly |
| | | Identify shorts, opens, voids, missing |
| | | 25. Electrically test |
| | | 26. Rework and repair as needed |
| | | 27. Package |
| | | 28. Ship |

FIG. 1

| Design PCB Assembly | Fabricate PCB (multilayer) | Assemble PCB |
|---|---|---|
| 1. Create schematic | 1. ~~Verify RoHS compliance~~ | 1. Procure components |
| 2. Indentify components | 2. ~~Cut core laminas to size & tool~~ | 2. ~~Verify RoHS compliance~~ |
| 3. Layout circuits | 3. ~~Clean and coat with resist~~ | 3. ~~Verify component solderability~~ |
| 4. Validate signal integrity | 4. ~~Image and develop resist~~ | 4. ~~Verify component MSL number~~ |
| 5. Validate design DfM | 5. ~~Etch and strip resist~~ | 5. ~~Kit components~~ |
| 6. Validate design DfR | 6. ~~Treat exposed copper~~ | 6. ~~Procure PCBs~~ |
| 7. Validate design DfE | 7. ~~AOI or visual inspect layers~~ | 7. ~~Verify RoHS compliance~~ |
| | 8. ~~Cut B stage to size and tool~~ | 8. ~~Verify PCB solderability~~ |
| | 9. ~~Lay up core and B stage~~ | 9. ~~Verify PCB High Temp capability~~ |
| | 10. ~~Laminate~~ | 10. ~~Design solder stencil & purchase~~ |
| | 11. ~~X-ray inspect (optional)~~ | 11. ~~Develop suitable reflow profile~~ |
| | 12. Create holes | 12. ~~Track component exposure (MSL)~~ |
| | 13. ~~Desmear or etchback~~ | (Rebake components as required) |
| | 14. Sensitize holes | 13. ~~Position PCB & stencil solder paste~~ |
| | 15. Plate electroless copper | (monitor solder paste) |
| | 16. Clean and coat with resist | 14. ~~Inspect solder paste results~~ |
| | 17. Image an develop resist | (height and skips) |
| | 18. Pattern plate copper | 15. ~~Dispense glue dots (optional)~~ |
| | 19. Pattern plate metal resist | 16. Place components |
| | 20. Strip plating resist | 17. Inspect for missing parts |
| | 21. Etch base copper | 18. ~~Reflow solder~~ |
| | 22. Clean and coat with soldermask | 19. ~~Repeat Steps 13-18 if two sided~~ |
| | 23. Image and develop | ~~assembly~~ |
| | 24. Repeat as needed | (second set of fixtures required) |
| | 25. Treat exposed metal | 20. Perform hand assembly as required |
| | 26. Route to shape | (odd sized or temperature sensitive) |
| | 27. Package | 21. ~~Clean flux from surface and under~~ |
| | 28. Ship | ~~Verify low standoff devices~~ |
| | | 22. ~~Test cleanliness~~ |
| | | 23. ~~Underfill critical components~~ |
| | | 24. ~~X-ray inspect soldered assembly~~ |
| | | ~~Identify shorts, opens, voids, missing~~ |
| | | 25. ~~Electrically test~~ |
| | | 26. ~~Rework and repair as needed~~ |
| | | 27. ~~Package~~ |
| | | 28. ~~Ship~~ |

FIG. 2

SOLDER ALLOY FREE ELECTRONIC (SAFE) RIGID-FLEXIBLE/STRETCHABLE CIRCUIT ASSEMBLIES HAVING INTEGRAL, CONDUCTIVE AND HEAT SPREADING SECTIONS AND METHODS FOR THEIR MANUFACTURE

CROSS-REFERENCE TO RELATED PATENT

This application is a continuation of U.S. Pat. No. 10,285,270, issued May 7, 2019.

COPYRIGHT NOTICE AND PERMISSION

This document contains some material which is subject to copyright protection. The copyright owner has no objection to the reproduction with proper attribution of authorship and ownership and without alteration by anyone of this material as it appears in the files or records of the Patent and Trademark Office, but otherwise reserves all rights whatsoever.

TECHNICAL FIELD OF THE INVENTION

The present invention relates to the field of electronic circuit assembly and more specifically to the manufacture of rigid flex circuit assemblies having electronic components attached to one or more sections of rigid thermally and/or electrically conductive materials which are interconnected by one or more flexible or stretchable circuit sections wherein all interconnections to the electronic components are achieved without the use of solder. Said connections being not only electrical and electronic in nature but also potentially optical.

BACKGROUND ART

The assembly of printed circuits, and more specifically the permanent assembly and interconnection of packaged integrated circuit (IC) components and discrete electronic components (e.g., chip resistors, chip capacitors, diodes, etc.) to the outer surfaces of both rigid and flexible circuit boards, has involved the use of some form of solder alloy (e.g., Sn63Pb37) since the earliest days of the electronics industry. The reasons for using solder assembly are numerous, but perhaps most important is that it has cost effectively enabled the mass joining of thousands of electronics interconnections between printed circuits of every type including rigid, flexible, stretchable and various combinations of these structures with the electrical terminations of the myriad different types of electronic components which may populate their surfaces.

While solder alloys have been most common, over the history of the industry other joining materials have been proposed and/or used, including isotropic and anisotropic adhesives or so-called "polymer solders" which are a form of conductive adhesive. In some cases even non-conductive adhesives have also been suggested relying on capacitive coupling to make the electrical interconnection and carry the signal. Moreover, there have been efforts to make connections separable by providing sockets for components, to facilitate removal and replacement if needed or desired. In addition, there have also been electrical and electronic connectors developed to link power and signal carrying conductors with various resilient contact structures, however all such structures require constant applied force or pressure to maintain connection and they occasionally fail in non-benign environments.

Adhesive and socket solutions are attractive for some applications because they do not require the exposure of the components mounted on them to high temperatures and the potential damage associated with the temperatures required for soldering, however, each of these solutions also has limitations related to cost, performance, reliability and combinations thereof. Though improvements are constantly being made, current generation adhesives are not as conductive as electronic solder and sockets and while they allow for easy component removal and replacement, they also add unwanted weight, volume and expense to the final assembly.

In recent years the electronics industry has been forced by European Union legislation to eliminate the element lead (Pb) from solder, based on a presumption of risk to humans. This had had both economic and technical impact on the industry. For example lead free solders contain higher percentages of tin and commonly use silver which is very expensive. The net impact of this legislation has been deleterious to the electronics industry as electronic assemblies are potentially less reliable because of the higher temperatures required along with other reasons unanticipated at the time legislation was passed. For example, there is known to be an inverse relationship between temperature and the long term reliability of semiconductor devices. Others factor causing reduced reliability are the facts that the lead free solder joints are proving more susceptible to shorting due to tin whiskers due to the absence of lead in the solder alloy (as has been reported by NASA researchers) and more prone mechanical failure when accidentally dropped. Other deleterious phenomenon includes such defects as opens, shorts, pad cratering and solder joint cracking. In addition, the greater energy use required to achieve the higher temperatures associated with lead free soldering has a negative impact both on manufacturing cost and the environment. Present day technical and trade journals for the electronics industry are replete with articles and technical papers describing problems associated with lead-free soldering and research into ways to make the problem less onerous. The high temperatures of lead free soldering significantly reduce the number of options available for use as a prospective substrate and tend to force the user to employ more expensive substrate materials to address the challenge of the higher soldering temperatures required.

There are significant problems and many steps required for the manufacture of a traditional printed circuit assembly. The major steps are presented in FIG. 1 to appreciate the complexity. As can be seen in FIG. 2 if one eliminates soldering from the overall process the number of steps can be significantly reduced.

Given the aforementioned problems in the assembly of both rigid and flexible circuits related to solder, especially for lead-free solders. This topic has been discussed and solutions offered in a number of issued and pending patents including the following issued patents: U.S. Pat. No. 8,193,042 Flexible Circuit Assemblies without Solder and Methods for Their Manufacture, U.S. Pat. No. 8,093,712 Monolithic Molded Flexible Electronic Assemblies without Solder and Methods for Their Manufacture, U.S. Pat. No. 8,067,777 Light Emitting Diode Package Assembly, U.S. Pat. No. 7,981,703 Electronic Assemblies without Solder and Methods for Their Manufacture, U.S. Pat. No. 7,943,434 Monolithic Molded Flexible Electronic Assemblies without Solder and Methods for Their Manufacture and U.S. Pat. No. 7,926,173 Method of Making a Circuit Assembly, however there is room for further improvement in circuit manufacturing and assembly technology especially in the field of rigid flex circuit manufacturing technology.

For example, even if traditional solders could still be used there is a challenge facing the industry because of the faster operating speeds and thus higher operating temperature of present day higher performance electronic components. Optical transceivers are also troubled by high heat generation which must be controlled as the wave length of transmitted light can and normally will vary with change temperature. Thus components are more frequently requiring the use of metal (e.g. aluminum) and/or ceramic (e.g. aluminum nitride) materials as heat sinks and heat spreaders to help dissipate the higher thermal energy protecting the components from the damaging heat. In this regard is important to note that it is a general property of metals that they can conduct to varying degrees both electricity and heat, however, other materials, such as ceramics, can conduct heat but not electricity. While it would be ideal to make substrates out of metal or ceramic, the use of heat sinks further exacerbates the lead-free soldering problem as their conductive and large thermal capacity draws heat away from the lead free solder, extending thermal exposures to greater duration and damaging components even more and/or resulting in "cold" or incompletely formed solder joints. Given the aforementioned is used in the assembly of both rigid and flexible circuits with solder, especially for lead-free solders, there is room for further improvement in rigid flex circuit manufacture and assembly technology such as can be achieved by using solder alloy free electronic (SAFE) assembly methods

BRIEF SUMMARY OF THE INVENTION

Rigid-flex circuits are highly desirable interconnection structures and have found many uses in electronic products, however, they are difficult to manufacture and assemble requiring many process steps and unfortunately exposure to high temperature soldering can cause delamination of the assemblies. Disclosed herein are rigid-flex circuit structures which are comprised of electronic components, a thermally conductive rigid carrier supporting the components and flexible or stretchable circuits areas which can be used to flexibly interconnect either to other areas of a common assembly or to other external elements. Depending on the material choices made for a particular rigid flex circuit design, there are many potential advantages to the disclosed process including: lighter weight assemblies, higher thermal dissipation assemblies, more reliable assemblies and reduced cost. All assemblies share the advantage of having no high temperature solder exposure requirement for assembly as interconnections between circuits and components are accomplished using low-temperature processes such as electroplating.

Accordingly, it is an object of the present invention to provide for the electronics industry improved electronic assemblies, especially rigid-flex circuit electronic component assemblies designed to be flexed for installation or in use, which do not require solder for interconnection. It is a further object of the present invention to provide improved methods for manufacturing of such electronic assemblies such that the assembly is comprised of metal or other thermally conductive sections onto or into which are disposed electronic components, said thermally and/or electrically conductive sections which bear the components being physically and electrically interconnected by flexible sections.

Briefly, one preferred embodiment of the present invention is a method for the manufacture of an electronic circuit assembly having at least one rigid metal/thermally conductive area wherein components are placed and at least one flexible area interconnected to the at least one rigid area and its components without the use of solder. In more typical applications there are more than one rigid area and at least one flexible area in the completed assembly.

For purposes of comparison and improved understanding of the novelty, in traditional rigid flex circuit assembly manufacturing a common method is to build flexible circuit subpanels and then laminate the subpanels either atop one or between two or more rigid metal clad laminates, which have areas cut out to allow for them to be flexed. FIG. 3 shows in cross section the basic steps of the process which comprise a) the fabrication of a flexible circuit, b) the lamination of the flexible circuit to, or between one or more rigid laminates and c) the completion of the circuit manufacturing process including plated interconnections between the internal flex circuit and the rigid laminate areas. A common subsequent step (not shown) would be to solder components to the surface of the completed rigid flex circuit.

To further aid understanding and appreciation of a common approach to the processing of rigid flex circuits, FIG. 4 offers a flow diagram showing the major steps in the manufacture of a traditional rigid flex circuit. After manufacture of a traditional rigid flex circuit, as previously noted, the circuit is moved to an assembly operation where electronic components are placed on it and soldered to the circuits to fix the components in place and interconnect them to one another in the electronic assembly. The final assembly can then be flexed or formed into a desired shape for the end application.

An alternative approach to manufacturing rigid flex circuit assemblies of similar function but requiring fewer processing steps is the subject of the present invention wherein a rigid flex circuit assembly having electronic components affixed on or to thermally and/or electrically conductive rigid sections which are integrally interconnected by flexible or stretchable sections with all said interconnections required for the assembly being accomplished without the use of solder.

These and other objects and advantages of the present invention will become clear to those skilled in the art in view of the description of the best presently known mode of carrying out the invention and the industrial applicability of the preferred embodiment as described herein and as illustrated in the FIGURES of the drawings.

BRIEF DESCRIPTION OF THE DRAWINGS

The purposes and advantages of the present invention will be apparent from the following detailed description in conjunction with the appended FIGURES of drawings in which:

FIG. 1 identifies a substantial number of the many different process steps required in association with the design, manufacture and assembly of a traditional multilayer PCB. This process flow shares many steps in common with those of a rigid flex circuit but not all and is meant to be instructive only for purposes of comparison with FIG. 2.

FIG. 2 is a comparison process flow which illustrates the number of process steps which might be avoided if a traditional multilayer PCB is produced in accordance with the basic principles of the processing of the invention, of special interest is the number of solder steps omitted with respect to the solder assembly process in column 2.

DESCRIPTION OF THE INVENTION

Figure 3:
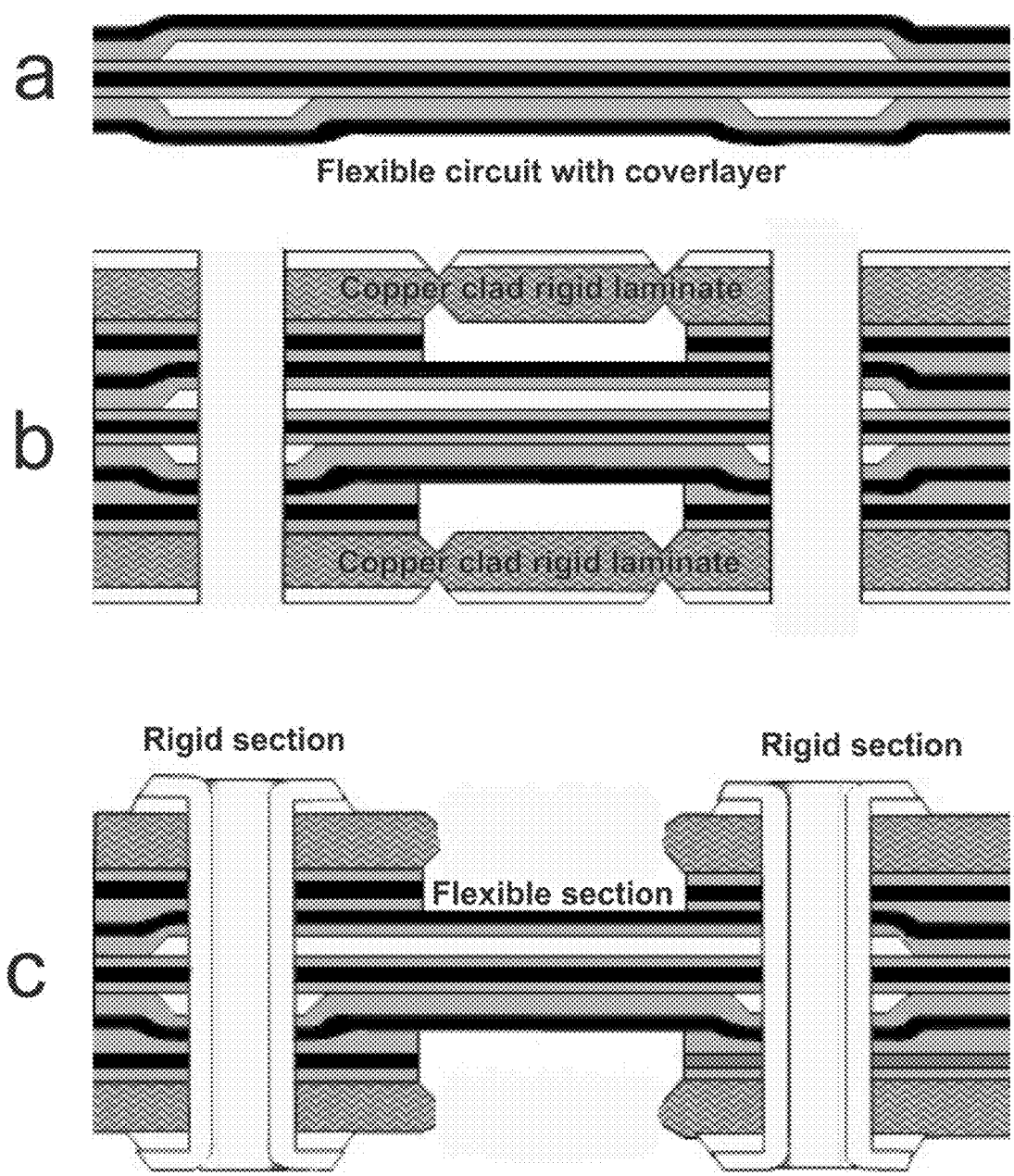
FIG. 3 depicts the major defining steps of the manufacture of a rigid flex circuit exclusive of the soldering processes which are presently used for assembly.
Figure 4:
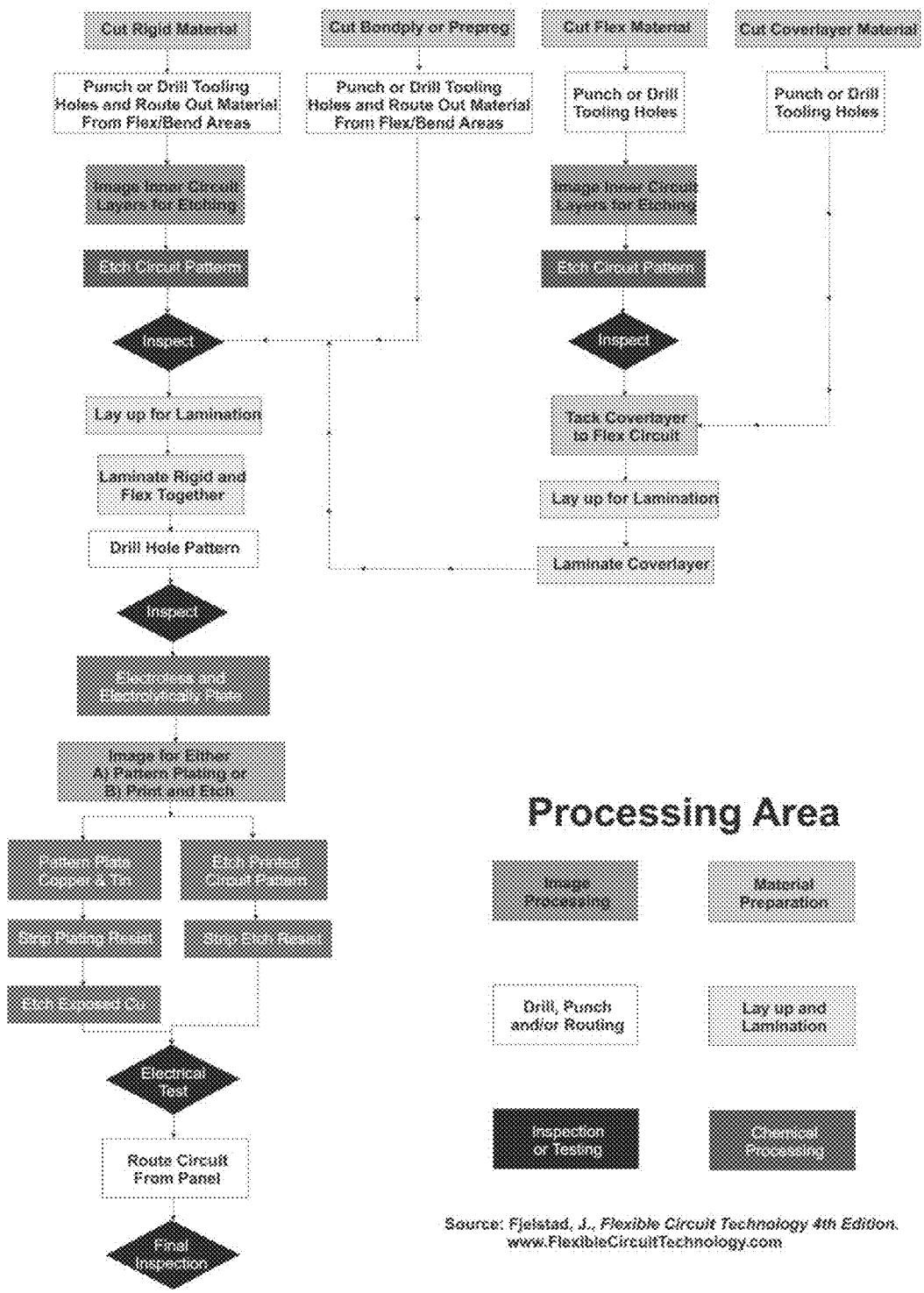
FIG. 4 provides in flow diagram format, the processing steps for a typical rigid flex board exclusive of the assembly steps

In the following description, numerous specific details are given to provide a thorough understanding of the invention. However, it will be apparent that the invention may be practiced without these specific details. In order to avoid obscuring the present invention, some well-known system configurations, and process steps are not disclosed in detail.

Likewise, the drawings showing embodiments of the system are semi-diagrammatic and not necessarily to scale and, particularly, some features are for the clarity of presentation are shown greatly exaggerated in the FIGS. Generally the invention can be operated in any orientation. The same numbers will generally be used in all the drawing FIGs. to relate to the same elements.

The term "horizontal" as used herein is defined as a plane parallel to the conventional plane or surface of the semiconductor package, regardless of its orientation. The term "vertical" refers to a direction perpendicular to the horizontal as just defined. Terms, such as "on", "above", "below", "bottom", "top", "side", "up", "down", "higher", "lower", "over", and "under", are defined with respect to the horizontal plane.

More specific to the present invention, rigid portions of rigid flex circuits are commonly stiff and unbendable. The flexible sections can vary in flexibility and may be simply formable into a predetermined shape or highly flexible and capable of enduring many flexural cycles. The rigid sections described throughout this specification are deemed to be thermally conductive to a greater or lesser degree depending on the materials used. Some structures will require high degrees of thermal conductivity and in such cases metals such as aluminum and aluminum alloys may be preferred but others including but not limited to: copper, copper alloys, iron alloys, magnesium. In other cases sufficient thermal conductivity may be achieved by means of composite materials comprised of polymers filled with thermally conductive material including but not limited to: ceramic particle filled polymer, metal particle filled polymer, nano-particle filled polymers. Inorganic ceramic materials may also be employed for rigid section thus ceramics such as but not limited to alumina (Al2O3), aluminum nitride (AlN) and boron nitride (BN) are potential candidates. Every material will have both benefits and drawbacks in terms of processing required thus many different embodiments must necessarily be described to give the reader an appreciation and understanding of the scope and applicability of the invention. Where referred to in the following descriptions the flexible sections can be made from any material commonly used for flexible circuits including but not limited to: polyimide, polyester, polyetherimide, flexiblized epoxies, fluroploymers, and paralyene. While most emphasis in the circuit industry is focused on copper circuits, polymer circuits are of potential interest in some of the structures which will be described as polymer inks can serve to both make interconnection both to and between components on an electronic assembly thus polymer inks including but not limited to: silver particle filled polymers, nano-silver particle filled polymers, nano-carbon particle filled polymers, nano-copper particle filled polymers and intrinsically conductive polymers. Also in this specification the term electronic component should be considered a general term which circumscribes all of the various types of components used in the manufacture of electronic assemblies including both active integrated circuits and passive devices such as resistors, capacitors, inductors and the like. The integrated circuit components used in the assemblies described herein are most desirably have standardized terminations making design layout simpler and allowing for the substitution of components of different manufactures of the same type device when desired. Integrated circuit components are also most desirably burned in and fully tested before committing them to use in an assembly but the use of bare die of uncertain quality is not necessarily proscribed as the manufacturer must weigh those risks for themselves. Similarly the quality of discrete devices is most desirably known in advance of their commitment to the assembly process. In some cases the term component extends to the coverage of interconnection devices used for making separable interconnections such as connectors and sockets. Finally, in the discussion of circuits and their interconnection to and between components while most of the emphasis will be on plated metal conductors and especially copper plated conductors and connections, the use of conductive and resistive inks can be embraced by all of the embodiments herein described and because of the stability of the base material as manufactured these structures should prove well-suited to allowing a designer to provide optical interconnection between components with in the assembly and to its edges for interconnection to other systems where required or desired.

A first embodiment of the present invention is a method for the manufacture of a rigid flex circuit using a thermally and/or electrically conductive substrate having electronic components placed level with its surface(s) and thereafter having integral interconnections made without solder, instead relying on plated interconnections between component leads an circuit traces. The final assembly is disposed for flexing when the assembly is complete. This is illustrated in the drawings herein, and particularly in the view(s) of FIG. 5-17, wherein the completed embodiment of the invention is depicted by the general reference of FIG. 17.

Figure 5:
FIG. 5-17 illustrate collectively an exemplary embodiment of both a process and a structure of the present invention wherein an thin layer of conductive material is left to bridge the rigid component bearing sections of the circuit where it might serve as an integral ground

Referring first to FIG. 5 a piece of thermally conductive rigid material (501) is selected suited to the needs of the design. If high thermal conductivity is desired, a metal such as aluminum, copper or copper alloy, be used. Other materials such as ceramics (e.g. Al2O3, BN, etc) or composites, such as epoxy resin with thermally conductive fillers such as ceramic, silicon or carbon powders may be useful in applications where lighter weight is desired while still having good thermal characteristics.

Figure 6:

Referring next to FIG. 6 cavities (601-604) are formed in the material creating a base structure (600) material. In the illustration the cavities are shown as conforming entirely to the outline of the components, however this is not a necessity. The cavities most desirably are sufficient to facilitate the components being made planar with the surface of the thermally conductive material and may be formed by any suitable mechanical or chemical process including NC machining, stamping, forming, molding or chemical milling. Though not illustrated, depending on the needs of the design, when finished, the part may be coated or treated to insulate the surface if desired using an appropriate process. For example if the material is aluminum it can be anodized to provide an insulating surface. With any other material including aluminum the conductive substrate may alternatively be painted or coated using electrophoretic coating methods, for example, which are well suited to providing uniform coating to all surfaces including corners and sharp edges. Also as an alternative to machining or mold forming cavities into the conductive substrate, a second material having apertures the size of the components and thickness equal to that of the components may be used. With respect to mold forming, differences in component height can be accommodated in the mold design process ensuring that all components will be planar with the surface of the conductive substrate.

Figure 7:
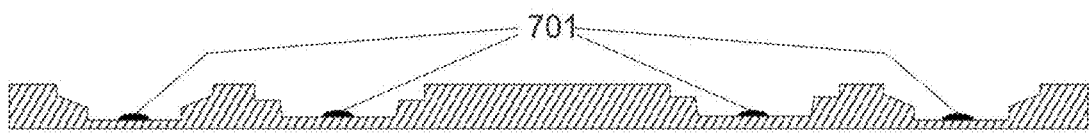

Referring now to FIG. 7 a small amount of adhesive (701) is placed into the cavities in advance of the components to secure them in position when they are placed in a subsequent step. Though not always critical because of its thinness, the adhesive may desirably be comprised of materials which have high thermal conductivity such as an epoxy filled with silver particles to improve thermal transfer.

Figure 8:
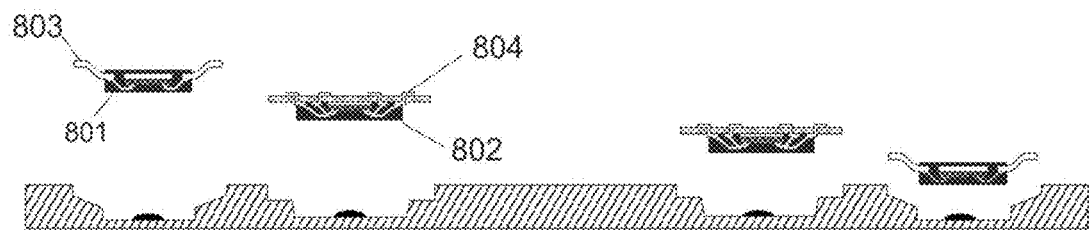

Referring next to FIG. 8 components (801, 802) are placed in cavities with their respective terminations (803, 804) facing away from the cavities. In the figure the components are shown attached only on one side, however to two-sided assembly is possible and may be advantageous in some applications. The cavities desirably match the thickness of the components. Having the cavities the same depth as the thickness of the components allow the devices to become proximately planar with the surface of the rigid areas.

Figure 9:

Referring now to FIG. 9 is shown the assembly with the components placed in the cavities and with their leads approximately planar to the surface (900)

Figure 10:

Referring now to FIG. 10 the thermally conductive substrate with components affixed in place is coated with an insulating material (1001) The insulating material is desirably homogenous and of a type familiar to circuit processing such as polyamide or flexible epoxy. The coating will desirably fill any gaps between component and the conductive substrate carrier. In certain circumstances the material used could be selected from materials which are photoimageable. Such a choice will allow for the exchange of a photo imaging step to be used in lieu of a laser drilling step or steps. While not shown in the figure, a flexible polymer or adhesive and clad with metal foil could also be used at this point allowing the circuit to appear as a standard metal clad laminate familiar to printed circuit board manufacturers. Such a choice would also potentially limit processing steps.

Figure 11:

Referring next to FIG. 11 where shown the assembly of FIG. 10 with holes (11001) drilled through the polymer to expose the leads of the now embedded component. While control depth mechanical drilling is possible for this step, the use of lasers to form what are referred to an industry as blind via holes is more common.

Figure 12:

Referring now to FIG. 12 where the assembly is shown and more advanced stage of processing. For brevity a number of processing steps have not been shown that the assembly is illustrated as having metal plated vias (1201) which connect a first layer of circuit conductors (1202, 1203) Note that well metal plated vias have been described other means of making connection the component I/O can possibly be suitable insert and applications included among them would be the use of conductive adhesives.

Figure 13:
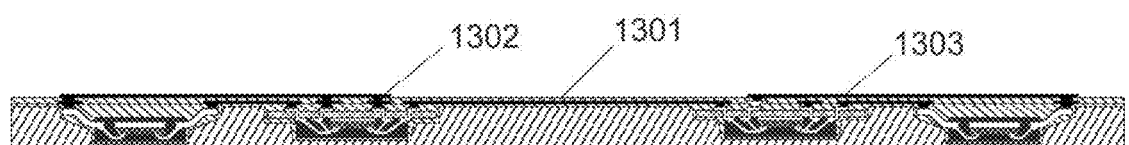

Referring next FIG. 13 where the assembly is shown yet again in a more advanced stage of processing and having a second layer of flexible insulation (1301) along with a second layer of plated vias (1302) and circuits (1303). Again for brevity many processing steps have not been shown but are well understood by those of average skill in the art.

Figure 14:
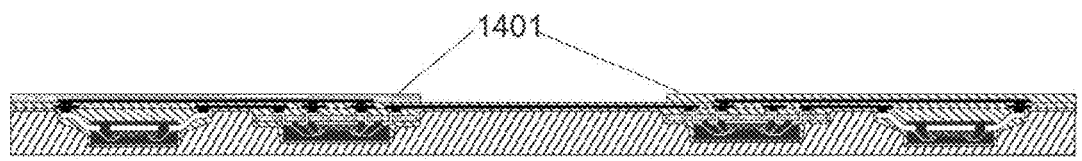

Referring now to FIG. 14 where the assembly is shown having a third layer of insulating material (1401). Because the material resides on a rigid section the requirement for flexibility is absent leaving open the possibility for the use of many different types of insulation materials of varying properties.

Figure 15:
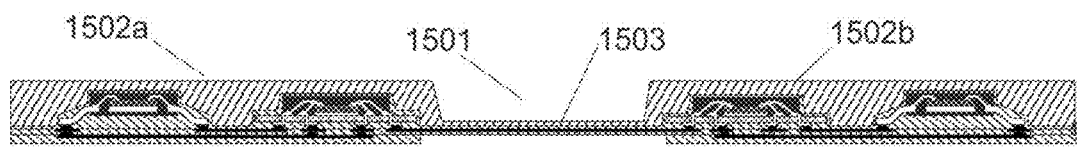

Referring next to FIG. 15 the assembly is shown having two separated rigid sections (1502a, 1502b) supporting and interconnecting components. The separation has been accomplished by the removal of nearly all of the rigid conductive material from the central section as shown creating a gap (1501) while leaving a thin, flexible bridge between the two rigid conductive sections. This structure represents a potential finishing point as the conductive material which also bridges the gap (1503) could potentially serve as a ground reference for high-speed signals. It should be noted here that while not illustrated it is clearly possible to advantageously make electrical interconnection to the conductive substrate.

Figure 16:

Referring now to FIG. 16 the assembly of FIG. 15 is shown with the last bit of conductive material removed exposing the initial flexible polymer layer (1001). The last bit of material can be removed by processes such as etching using chemistries such as ferric chloride solution to remove the excess metal. Such a construction has the advantage of being more flexible due to the absence of the extra metal and reduced overall thickness.

Figure 17:
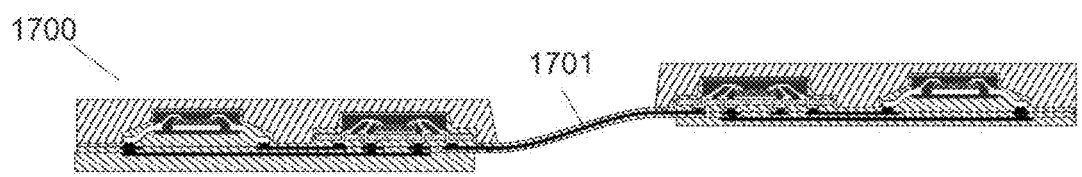

Referring finally to FIG. 17, the last of the series on this embodiment where is illustrated a finished assembly (1700) with a flexed bridging circuit (1701) as might be required for an application.

Figure 18:
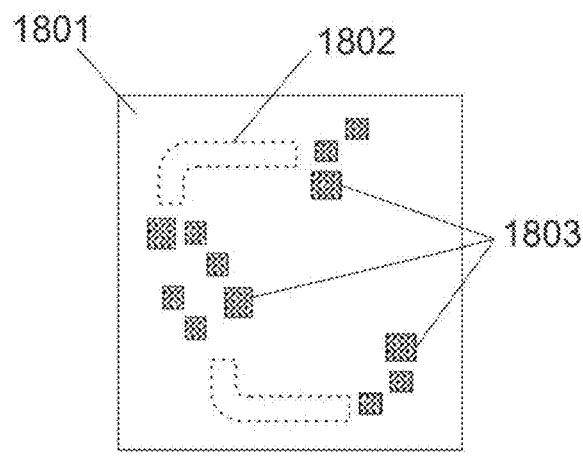
FIG. 18-20 illustrate collectively, in both planar and perspective views the major process steps of the present invention both in panel form as processed and after removal.
Figure 19:
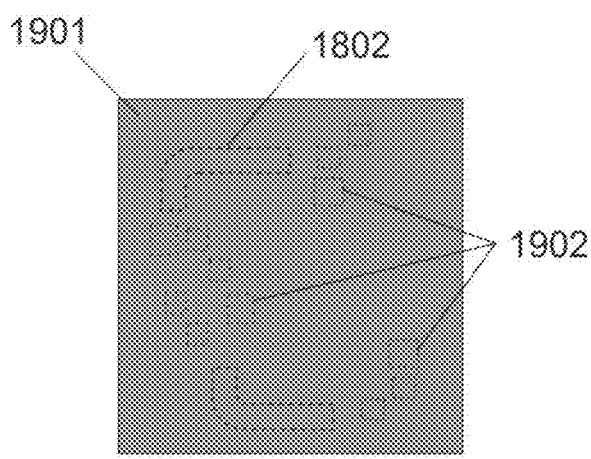
Figure 20:
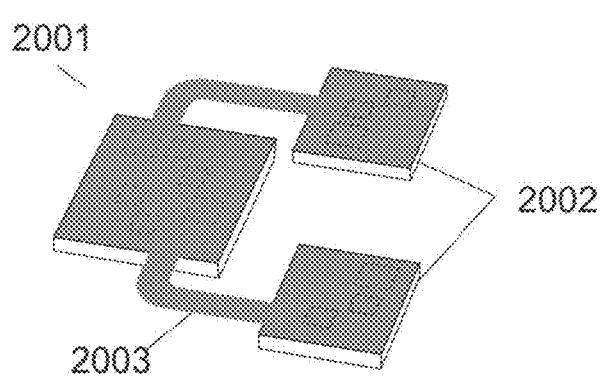

FIG. 18-20 offer plane and perspective views in abbreviated form to aid understanding of the process and nature of the invention in a general form.

Referring now to FIG. 18 where shown a conductive substrate panel (1801) having cavities formed on the opposite side as represented by ghost lines (1802) and having components with terminations facing up and away from the substrate (1803)

Referring now to FIG. 19 the panel substrate is shown having a flexible insulating material (1901) applied to its surface covering the components (1902) which are shown as ghost lines as are the opposite side cavities (1802)

Referring finally to FIG. 20 the last of the series, a completed assembly (2001) is shown and perspective view with both rigid sections (2002) and flexible sections (2003)

A second embodiment of the present invention and process for the manufacture are illustrated in this series of figures represented by FIG. 21-32. This series illustrates the manufacture of a rigid flex assembly having components on both surfaces with interconnections and flexible links on both sides.

Figure 21:
FIG. 21-32 illustrates, a another exemplary embodiment process and structure for the present invention

Referring first to FIG. 21 where shown a piece of thermally conductive material (2100) as previously discussed the material could be selected from among many types but the metal aluminum as many attractive features for such structures. Aluminum is for example closely matched in coefficient of thermal expansion (CTE) to the metal copper (CTE of Al=.about.24 ppm/.degree. C. vs CTE of Cu=.about.18 ppm/.degree. C.). Aluminum is also fairly low density at 2.8 grams per cubic centimeter and depending on alloy relatively inexpensive at two dollars per kilogram at the time of this writing. Aluminum also has the unique ability of being suitable for anodizing making it surfaces insulators while its core retains both its electrical and thermal conductivity. Aluminum is also relatively transparent to high-energy particles such as x-rays this fact coupled with the elimination of solder, which can block or impede x-rays and other high-energy particles, makes the material combinations which can be manufactured without solder and are described herein good potential candidates for high-energy particle investigations and medical applications. For these reasons, aluminum will be used as the primary example for this discussion but the invention is not limited to the use of aluminum alone as previously stated.

Figure 22:
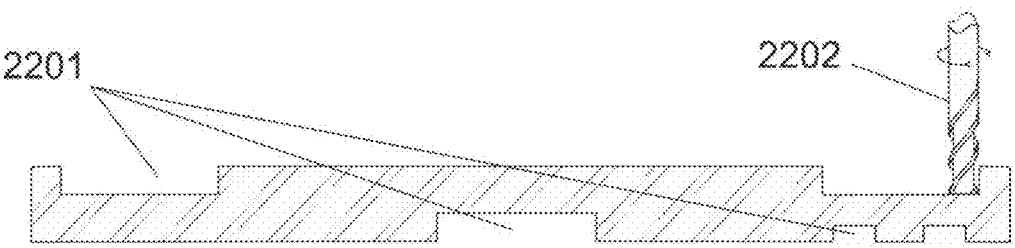

Referring now to FIG. 22 where shown cavities (2201) formed in the substrate using a milling machine tool (2202). Again as mentioned previously the cavities can be formed by any suitable process and chemical milling is one such having the advantage of an ability to produce many cavities at one time. If different depths are required, the panel can be reprocessed more than once protecting those areas already etched from subsequent etching steps to create different depths.

Figure 23:
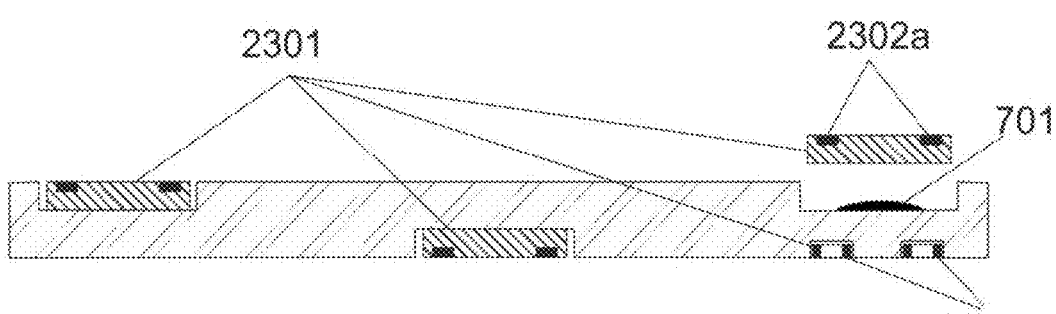

Referring next to FIG. 23 where components (2301) having exposed terminations (2302a, 2302b) planar to the surface. The components are fixed and held in place using a suitable adhesive (701) as previously discussed.

Figure 24:

Referring next to FIG. 24 where the assembly is shown with a first layer of flexible material (2401) of types described earlier is applied uniformly to both surfaces. An example of a process suited to such application is roll lamination where heated rollers and pressure are used to apply a flexible polymer film to the surfaces of the assembly. Other methods familiar to the industry may also be used including screen printing, curtain coating and roll coating of polymers in liquid form.

Figure 25:
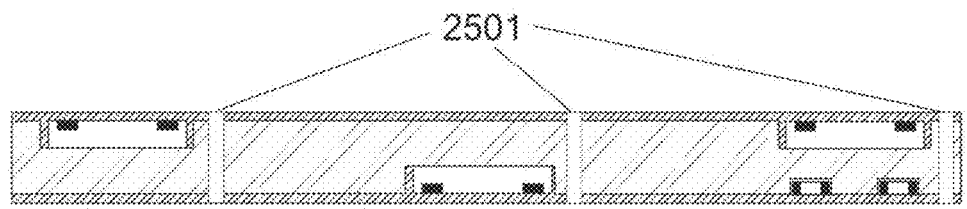

Referring now to FIG. 25 where the assembly is shown having holes (2501) mechanically drilled through both the polymer surfaces and the conductive substrate material.

Figure 26:
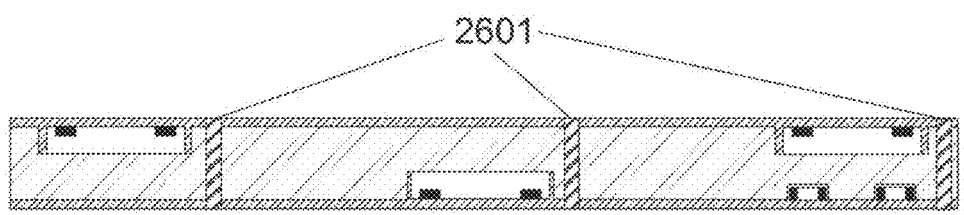

Referring next to FIG. 26 where shown shows the filling of the holes of rigid carrier that is comprised of a solid metal such as aluminum or copper. The holes may be filled with an insulating material (2601) such as an epoxy resin. Further, the epoxy may be filled to proximally match the CTE of the carrier. Moreover, because it is possible to anodizing aluminum it may be possible in certain circumstances when the holes are drilled through the aluminum to use and anodizing process to make them nonconductive. Furthermore the holes could be reliably produced at the same time as the cavities and if a coating process such as electrophoretic coating is applied the holes and surfaces of the cavities could be coated in one step simplifying the process.

Figure 27:
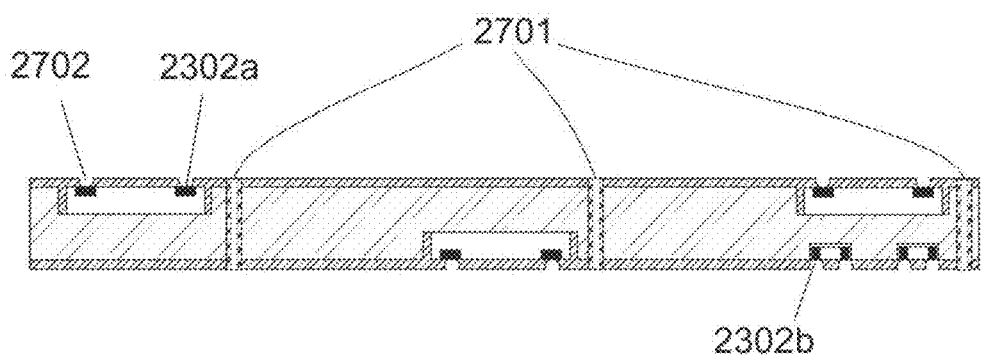

Referring now to FIG. 27 where the assembly is shown having been provided with both through holes (2701) and blind be a holes (2702) to access terminations on components (2302a, 2302b) for subsequent processing.

Figure 28:
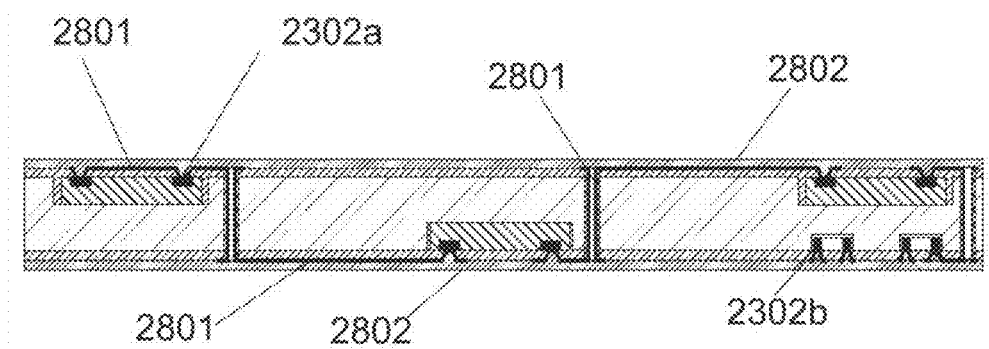

Referring next to FIG. 28 the assembly is shown for purposes of brevity with all through holes and blind via holes having been plated down to terminations (2302a, 2302b) with a metal such as copper (2801) along with circuit patterns and having a subsequent polymer layer (2802) applied over the top of the assembly sealing in the metal circuits protecting them from the environment. Note again that for the purposes of brevity this embodiment is shown with only one circuit layer on each side but it should be abundantly clear to those of average skill in the art that more than one layer of circuits can be provided by employing a series of the same processes in sequence.

Figure 29:
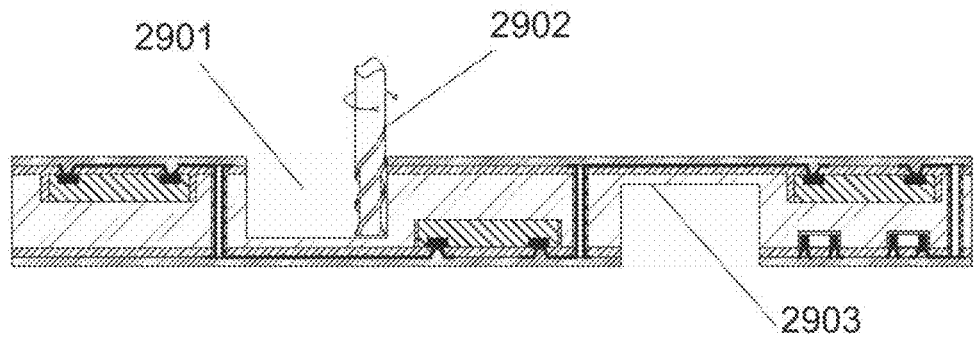

Referring now to FIG. 29 the assembly is shown at a further step in processing were cavities (2901, 2903) have been opened using a machining process and milling tool (2902). As previously discussed it may be of interest to the designer to leave the thin layer of metal intact as a metal ground bridging the rigid areas as the assembly though not necessarily flexible would be bendable/formable.

Figure 30:
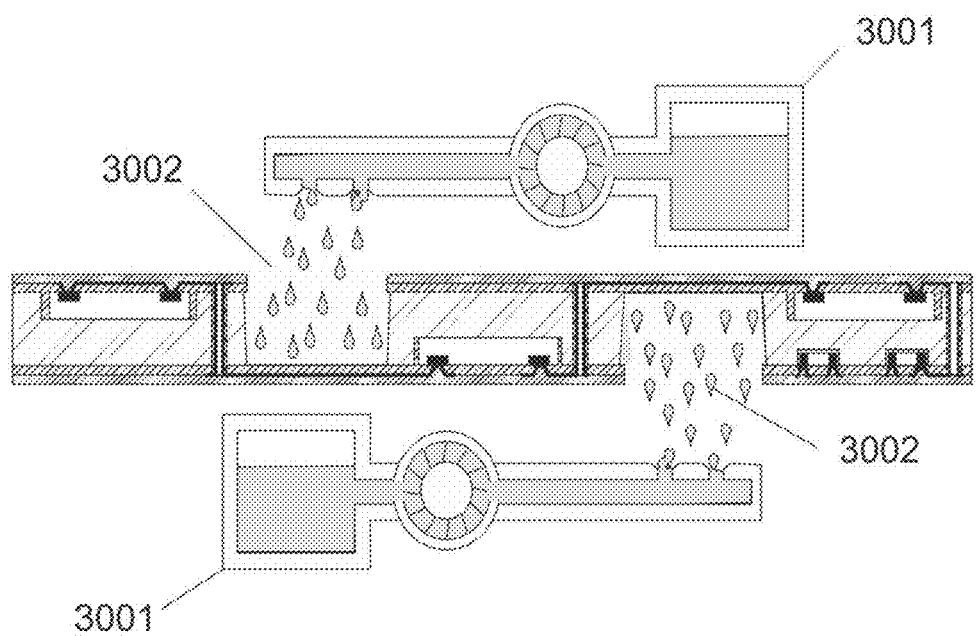

Referring next to FIG. 30 the assembly is shown mid process wherein etching machine (3001) is used to spray suitable chemistry (3002) to remove excess metal from the bottom of the cavity.

Figure 31:
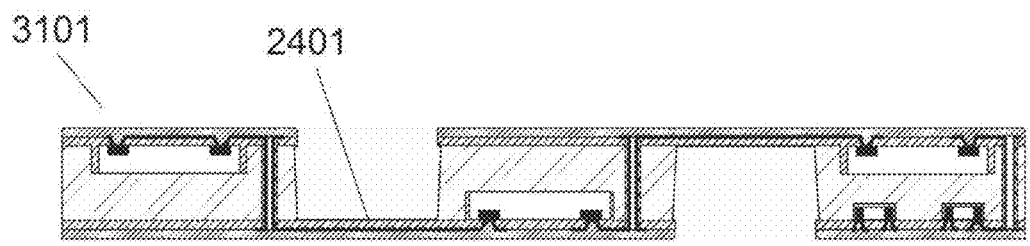

Referring now to FIG. 31 the assembly (3101) is shown with the first layer polymer (2401) exposed after residual metal was removed from about it surfaces.

Figure 32:
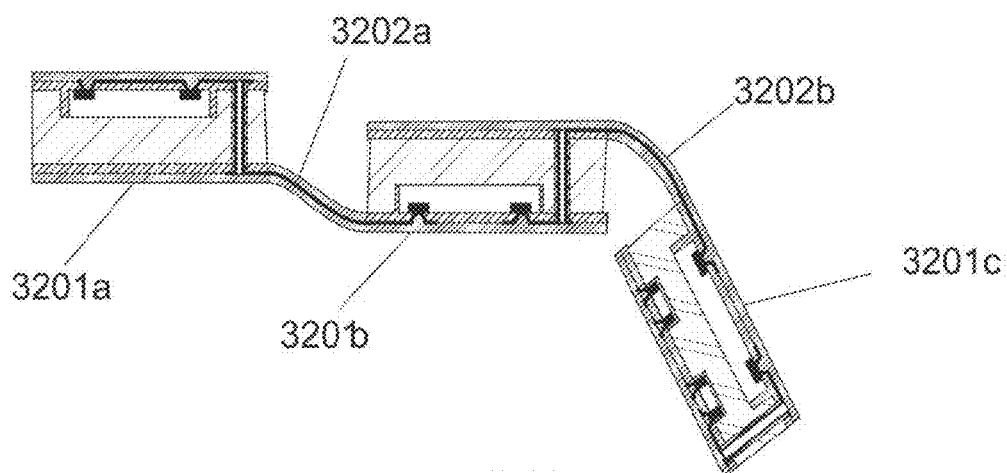

Referring next to FIG. 32 first, the assembly is shown having been flexed and formed with rigid sections (3201a, 3201b, 3201c) interconnected by flexible sections (3202a, 3202b)

Figure 33:
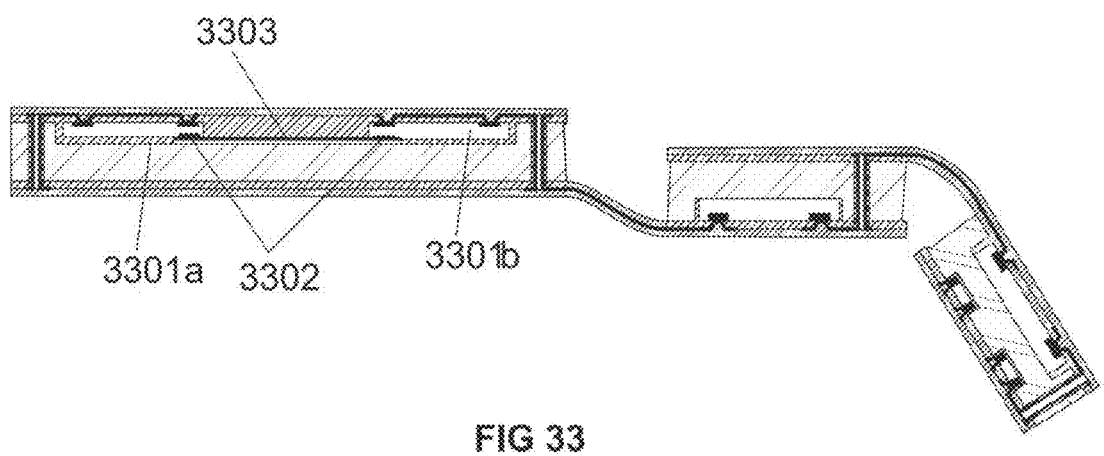
FIG. 33 illustrates a cross sectional view of a specific embodiment of an assembly having two surface interconnections on certain embedded components with one interconnect surface adjacent to the conductive base and the other near the surface facing away from the conductive base.

Referring finally to FIG. 33, where is illustrated a third embodiment of the invention in the assembly shown in cross section wherein certain components (3101a, 3101b) have both first or upper (i.e. top) and second or lower (i.e. bottom) surfaces available for interconnection and are interconnected on a second surface at locations (3302) through a conductor (3303) residing on the lower surface of the cavity. Interconnection to the second sides can be accomplished by means of mechanical pressure on bumps or posts or the use of conductive adhesives or anisotropic conductive adhesives. Solder may also be used for said second side connections because the connections will be encapsulated and thus more protected, however solder is not a preferred material. Note also that interconnection between the two components (3101a, 3101b) can be accomplished by means of a circuit assembly circuit which is either prefabricated and then placed in the cavity, or alternatively produced in situ. In practice, components having connections on two surfaces are useful in some applications where a high level of signal integrity is required.

A fourth embodiment of the present invention and process for its manufacture are illustrated in this series of figures represented by FIG. 34-37. This series illustrates the manufacture of a rigid flex assembly having components on one but acknowledging that the process would also be suitable in cases where components were provided on both sides.

Figure 34:
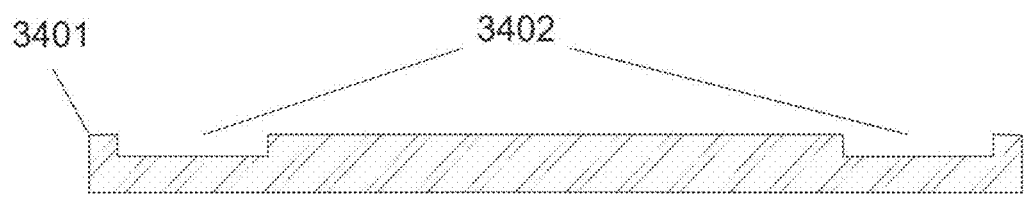
FIG. 34-39 illustrate collectively, another exemplary embodiment of a process and structure for the present invention wherein flexible elements are prefabricated and bonded to the conductive component bearing elements making both physical and electrical contact.

Referring first to FIG. 34, the substrate (3401) is provided with cavities (3402) which will subsequently accurately locate and support components. While relief cavities have been described throughout this disclosure a stencil defining the outlines of the components and placed on the metal carrier may be sufficient. Such a carrier could be made more economically using processes such as punching or chemical milling. Finally, in certain cases where the components are sufficiently thin and all of common thickness, the need for cavities could be obviated.

Figure 35:
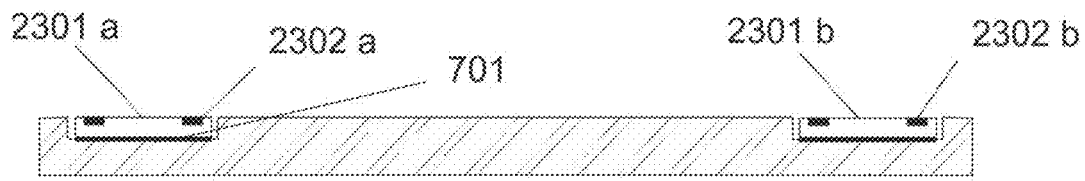

Referring next to FIG. 35, components (2301 a, 2301 b) are fixed in place using adhesive (701) and are shown with their electronic terminals exposed (2302 a, 2302 b)

Figure 36:
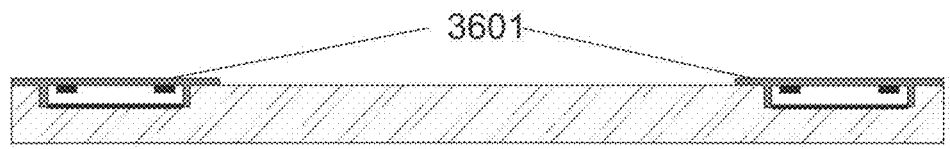

Referring now to FIG. 36 the assembly is shown with an adhesive material (3601) disposed over the top of the components referred to in FIG. 35 leaving the other areas of the assembly uncoated. The adhesive material is preferably and anisotropic conductive adhesive film such as Hitachi's ANISOLM product but in certain cases it them nonconductive film may be suitable. Though not illustrated the adhesive material could be comprised of a pattern of nonconductive and conductive adhesives with a conductive adhesive located atop the terminations of the components.

Figure 37:
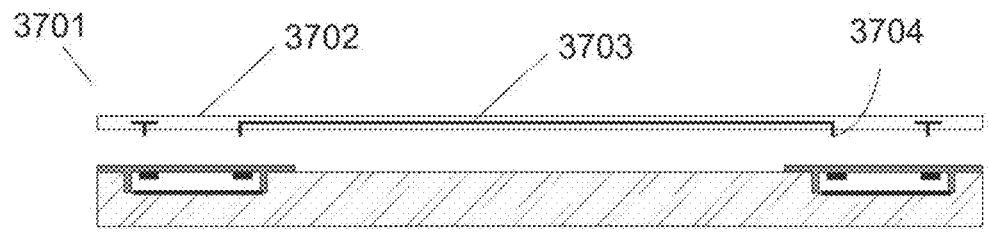

Referring next to FIG. 37 a prefabricated flexible circuit (3701) comprised of a flexible base film and cover lay construction (3702) with a central conductor(s) (3703) and also having elevated contacts (3704) is shown disposed above the assembly described in FIG. 36.

Figure 38:
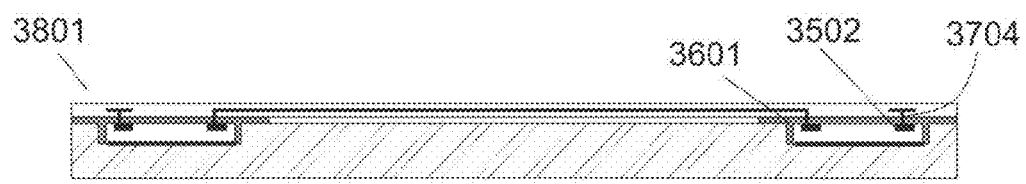

Referring now to FIG. 38 where assembly (3801) has been created by joining the flexible circuit to the carrier with the adhesive material (3601) in the areas that will be maintained in the final assembly and electrical connection is established between component termination (3502) and elevated contacts (3704)

Figure 39:
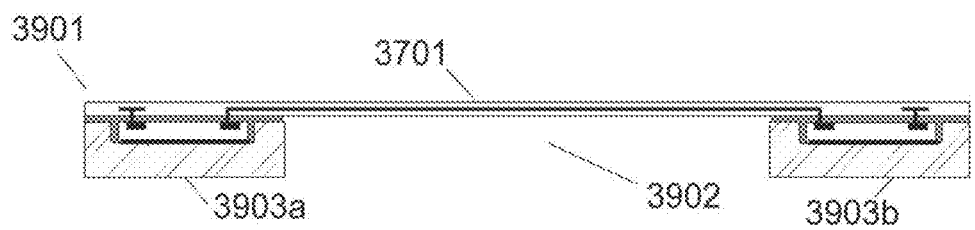

Referring finally to FIG. 39 where is shown a finished assembly of this embodiment (3901) the base material having been removed from a central section to create an opening (3902) resulting in rigid sections (3903a, 3903b) electrically and physically interconnected by flexible circuit (3701)

A fifth embodiment of the present invention and process for the manufacture are illustrated in the series of figures represented by FIG. 40-FIG. 50 which show a method for the manufacture of a rigid flex circuit structure wherein electronic components are placed into cavities which are formed in one or more pieces of rigid material, encapsulated and joined to a flexible circuit. While the figures provided illustrate a process involving two rigid sections joined to a single metal layer flexible circuit, depending on the complexity of the processing, one, two, three or more rigid layers can be prepared and joined to one or more flexible circuits using the process steps described. Thus the use of two rigid sections and one flexible section in this description is instructional only and is not intended to limit the scope of the potential of the process herein disclosed to the embodiment shown for teaching purposes. As with other embodiments disclosed in this specification, a key feature of the completed rigid flex assembly is that integral electrical interconnections are made between components and circuits without solder, instead the finished structure relies on plated metals and circuits using methods familiar to the printed circuit industry to make interconnections directly to the component leads. It should be noted that the process is not limited to plated metals. In some cases it may be desirable to use conductive inks to form both circuits and interconnections to electronic component leads using such methods as screen printing, stencil printing, ink jet printing and similar methods. It should be noted also that in some cases it may be desirable to print resistive materials onto certain terminations of electronic components. The following series of figures will help inform the reader as to the basics of the process.

Figure 40:
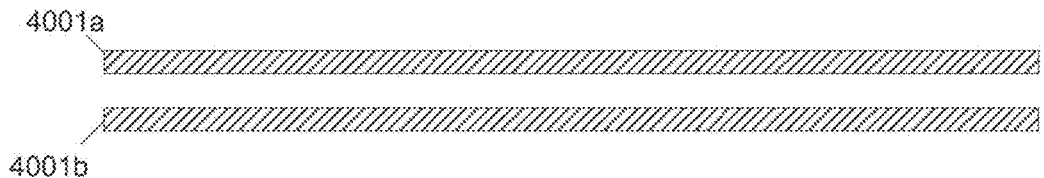
FIG. 40-50 illustrate collectively, another exemplary embodiment of a process and structure for the present invention wherein the flexible circuits are prefabricated and bonded between conductive component bearing rigid elements with interconnections to the internal flexible section(s) provided by means of plated through holes

Referring first to FIG. 40 shown in cross section are two pieces of rigid material, (4001a, 4002b) which may be comprised of any suitable, preferably conductive, material including a metal such as aluminum, a composite material such as a copper clad epoxy glass laminate, graphite epoxy, a thermoplastic engineering material such as PEEK or a combination of any or all of the aforementioned allowing that pieces of different types of rigid material may be employed in the manufacture of a completed assembly to form a hybrid material substrate. Note also that when a metal layer is used at part or all of the construction, the metal may require that an insulation material such as an electrophoretically deposited polymer coating coated be provided over its surfaces and within its through holes (not shown in this view) prior to other processing.

Figure 41:
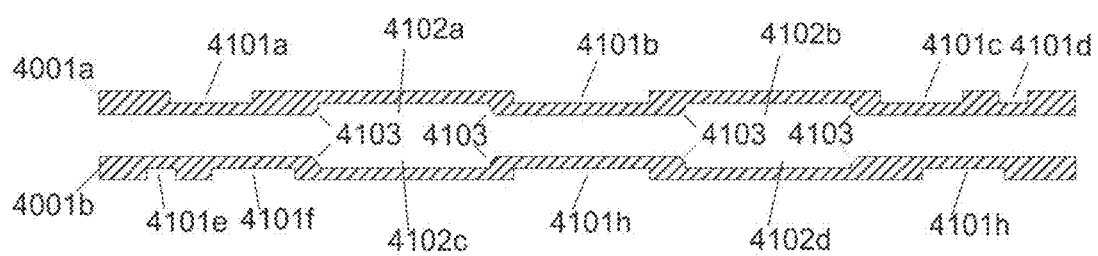

Referring next to FIG. 41, the rigid material elements of construction (4001a, 4001b) are shown having been further processed by the provision of cavities on both surfaces (4101a-4102h). Depending on the material the processing may vary. For example, the cavities may be produced by chemical etching or machining of a metal or the machining or molding of composite or thermoplastic materials of high thermal conductivity. In the FIG. cavities (4101a-4101d) are provided for the subsequent placement of electronic components on the upper or first piece of rigid material and cavities (4101e-4101h) are provided on the bottom or second piece of material surfaces. Similarly cavities are provided on the second surfaces of both pieces of material with cavities (4102a and 4102b) being provided on the upper piece of rigid material and cavities (4102c and 4102d) being provided on the bottom piece of material. (These cavities will later serve to provide a gap which will be necessary for a subsequent later process step involving the machining away of rigid material from these locations.) The edges of the material are desirably beveled or rounded as seen in certain locations (4103) which are the areas where the flexible portions of the final assembly will ultimately ingress and egress from the rigid sections. The purpose of these features is to mitigate any potential to the flexible circuit at this location by the elimination of a sharp edge. As mentioned previously if aluminum is the chosen metal for the rigid sections, it may be beneficially anodized to make the surface an insulator. Also again restated here for emphasis aluminum or any other metal may also be coated with a polymer for similar provision of an insulating layer. The metal may also the left untreated in certain areas allowing it to be used for electrical purposes, such as a ground for example in addition to its function as a heat spreader. Though not shown, if a thermally conductive copper clad laminate is used as a substrate for the structure, the remaining copper setback from the cavities could provide a similar benefit.

Figure 42:
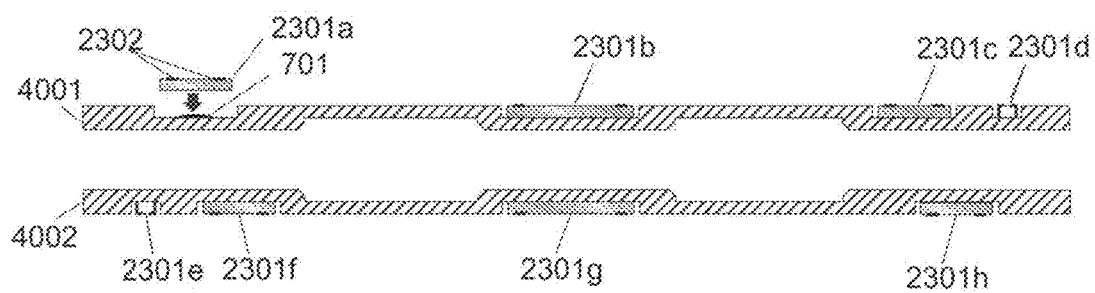

Referring now to FIG. 42 there is illustrated a further processing step wherein electronic components (2301a-2103d) are placed into the cavities on the upper piece of material (4001) and additional components (2301e-21030 are placed in the bottom piece of material (4002). A component (2301a) with I/O contacts (2302) is shown disposed above the cavity ready for placement and attachment to suitable adhesive (710) such as a conductive epoxy. As previously mentioned and repeated here for emphasis, the components used component are preferably tested and burned before placement because rework of defective parts will be difficult.

Figure 43:
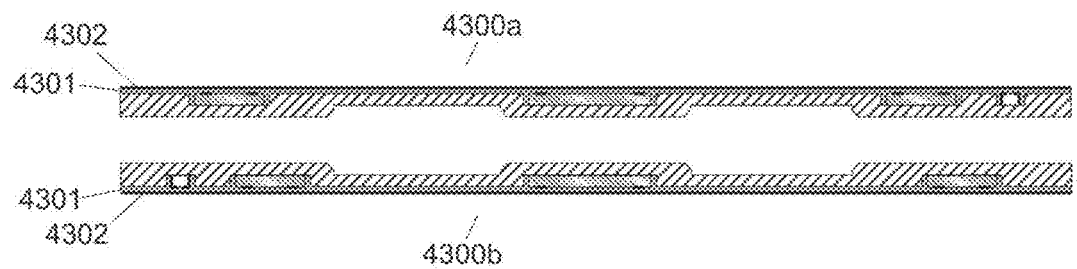

Referring next to FIG. 43 upper and lower rigid sections (4300a and 4300b) having electronic components positioned in place placed are each coated with layer of encapsulating material (4301) such as an epoxy which preferably fills any space around the components. Other materials may be suitable for this purpose including sheets of adhesive clad polymer or thermoplastic or thermosetting films and the material may be reinforced with materials such as glass if desired. Surfaces may be further coated with a metal layer (4302) such as in the form of a copper foil which will serve subsequent processing needs relative to electroplating. However, the copper or other metal layer may also be deposited using electroless and electrolytic processing as a separate step after coating. Additionally, there are commercially available materials referred to as resin coated copper (RCC) which allow the user to bond the copper directly to a substrate with an insulating layer in a single step.

Figure 44:
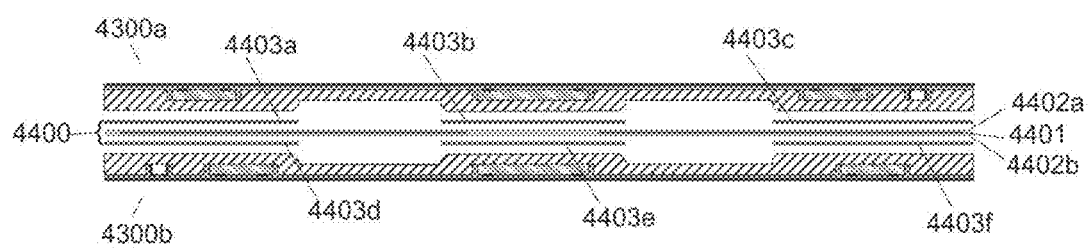

Referring now to FIG. 44 where shown the component bearing rigid sections 4300a and 4300b disposed above and below a flexible circuit (4400) comprised of a central metal (typically copper) conductor (4401) encapsulated and protected by insulating layers (4402a-4402b). Between raised rigid areas and the flexible circuit areas proximate to them is disposed adhesive material (4403a-4403f) for bonding layers together. The bonding material may be of any suitable material commonly used for such bonding purposes such as thermosetting epoxy film, epoxy impregnated glass fabric or other suitable bonding material.

Figure 45:
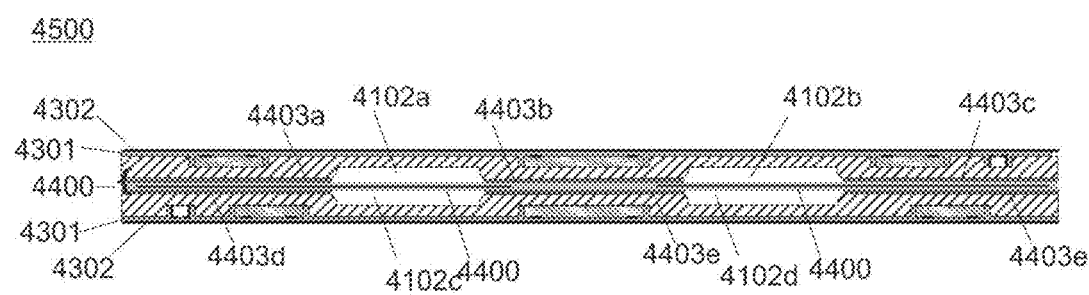

Referring next to FIG. 45 where is shown the now laminated assembly (4500) constructed from all of the elements shown in FIG. 44 with adhesive areas (4403a-4403e) having flexible and rigid sections securely joined and cavities (4102a-4102d) having contiguous flexible circuit (4400) spanning the gap between rigid areas.

Figure 46:
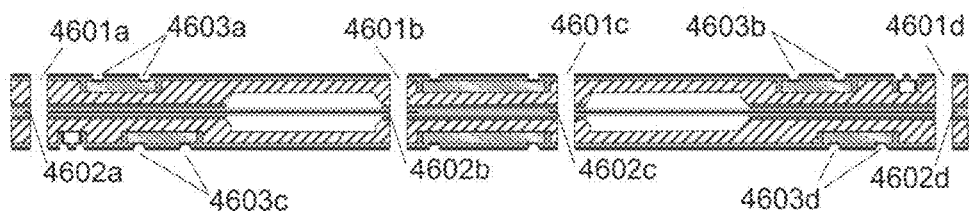

Referring now to FIG. 46 where shown the assembly (4600) at a subsequent stage of processing wherein holes (4601a-4601d) are drilled through the assembly at predetermined points to expose points of connection with the flexible circuit internal metal (4602a-4602b) to make it available for subsequent interconnection by plating. Other surface via groupings (4603a-4603d) are formed or drilled using a suitable process such as laser ablation or controlled depth drilling to provide access to component I/O terminations. Processes other than mechanical drilling may be used in the formation of surface vias. For example chemical or plasma etching of the polymer insulation coating may be used to expose the terminations. Note that if a metal core is to be used, it is important to pre-drill and fill holes with an insulating material to prevent shorting to the central metal core of the rigid sections when a subsequent plating step is performed as was described in reference to FIG. 26.

Figure 47:
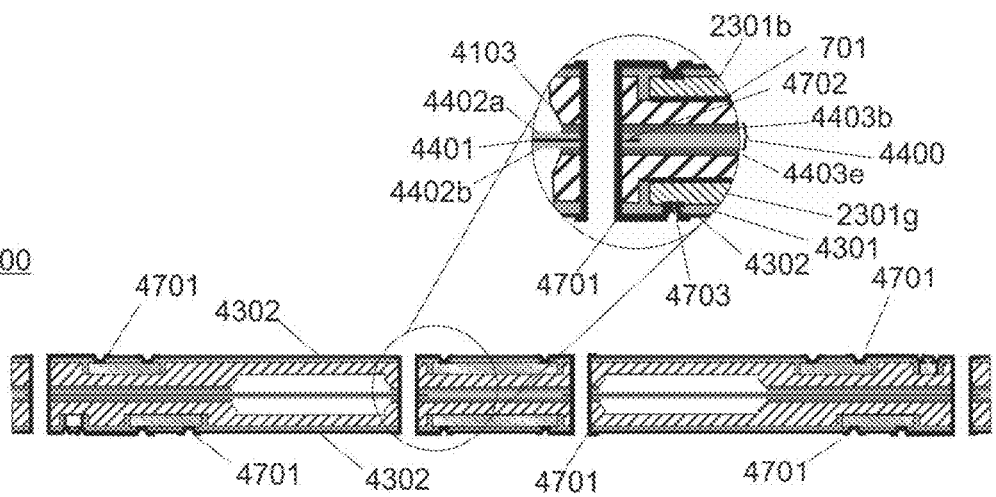

Referring next to FIG. 47 which shows the assembly shows assembly (4700) at a subsequent process stage where wherein copper metal (4701) is plated to form circuit patterns and to plate both surface vias and through holes. The process is typically performed by using a combination of electroless and electrolytic processes. Omitted from this series of drawings is an imaging step to form first circuit patterns and provide openings to vias and through holes for plating which those skilled in the art will know must have taken place. An enlarged view of a portion of the cross section is provided to better illustrate the various elements of construction of this embodiment of the rigid flex circuit elements up to this point of its manufacture including the metal plating (4701) in a representative through hole and plated electrical interconnection to the flex circuit metal (4401) at a representative point (4702) as well as the plating to a representative component termination feature (4703). The other features identified are described in previous figures of special note however is representing the copper surface (4302) which supplied continuity for plating but which must be removed by a subsequent etching step to free the circuit pattern from the background metal.

Figure 48:
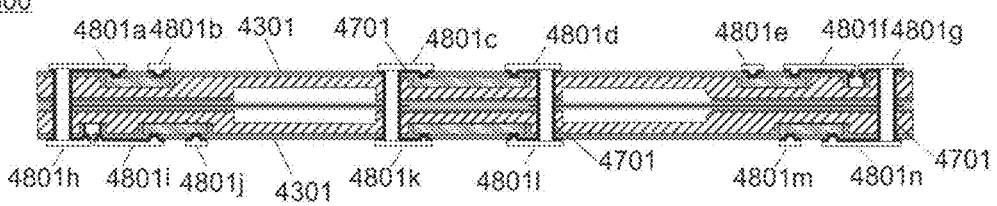

Referring to FIG. 48 where is provided a view in cross section of the embodiment at a subsequent step in its processing (4800), specifically a step wherein the desired surface circuits are patterned using a chemically resistant polymer which may be directly applied or imaged in situ using a photopolymer film which is exposed an developed. In either case the pattern is provided and it is represented in the figure by drawing features 4801a through 4801n which protect both surface copper circuits any copper in through holes and surface vias. In the figure an etching process has been executed which removed all unprotected copper exposing insulating surface 4301. Note that while only one layer of circuitry is shown in this example more than one layer of circuitry may be required by a design and are thus assumed to be a potential part of this embodiment.

Figure 49:
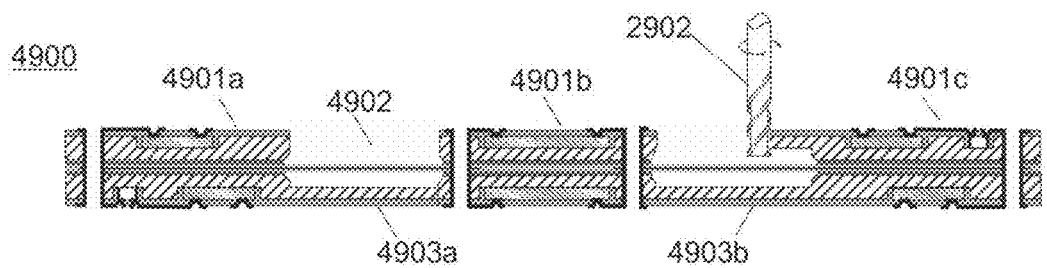

Referring next to FIG. 49 where is shown a further step in the processing of the rigid flex circuit assembly (4900) wherein the rigid upper surfaces which protected in process the internal flexible circuit areas which bridged the internal gaps between the vertically contiguous rigid areas with plated through holes (4901a-4901c) is removed by a process such as routing or milling as exemplified by the routing tool shown (2902). One representative area (4902) is shown having the material removed while other areas (4903a and 4903b) await such processing. Machining with a router is a common method but other methods are possible including use of a laser or in some cases chemical etching when a metal cap is used.

Figure 50:
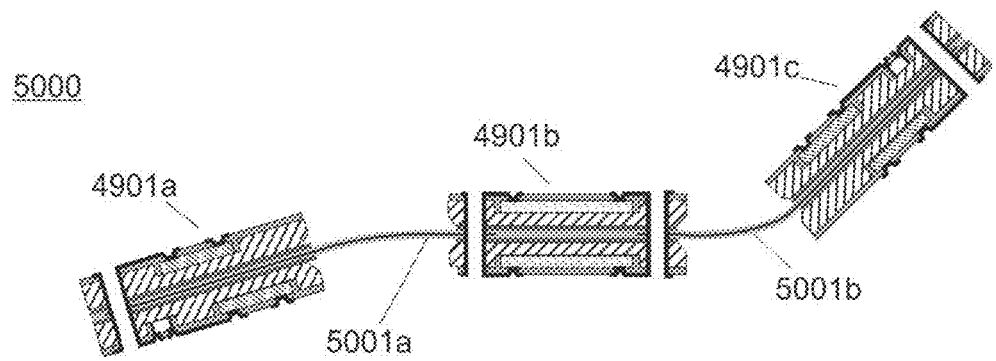

Finally in FIG. 50 is shown in cross section the rigid flex assembly with interconnected components (5000) the process having been completed without the use of any solder. The vertically contiguous rigid sections with plated through holes (4901a-4901c) are shown free to move independently limited only by the flexible circuit areas 5001a and 5001b which physically and electrically interconnect them.

Figure 51:
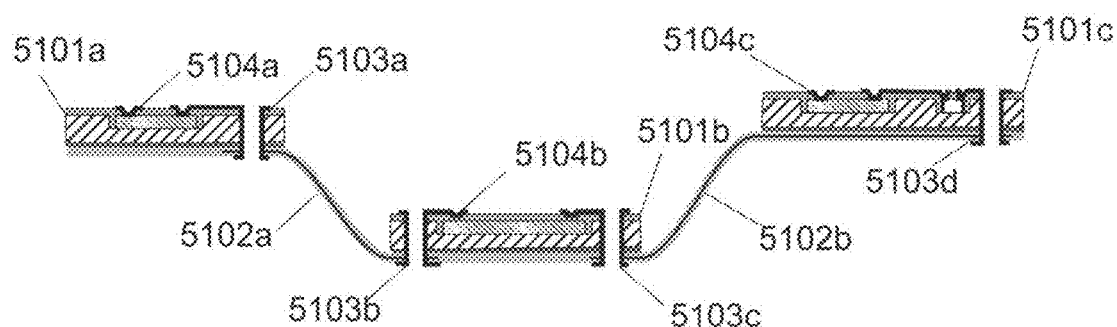
FIG. 51 illustrates at once, another exemplary embodiment of a structure for the present invention having a flex circuit physically and electrically interconnecting rigid thermally conductive sections bearing electronic components.

FIG. 51 illustrates in cross section another embodiment of the invention 5100 a rigid flex circuit having three rigid sections (5101a-5101c) with embedded components. The sections are physically joined by an integral and contiguous flexible circuit that flexes in locations 5102a and 5102b and the embedded/subsurface components are interconnected by means of both plated through holes (5103*a*-5103*c*) and plated surface vias (5104*a*-5104*c*) to component terminations.

Figure 52:
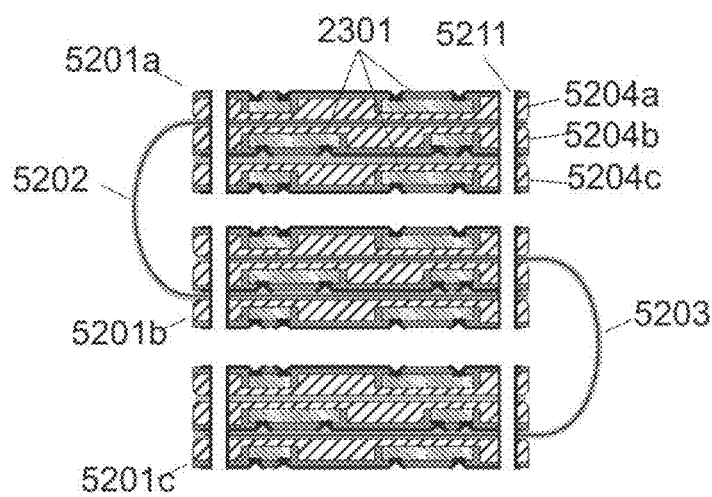
FIG. 52 illustrates at once, another exemplary embodiment of a structure for the present invention wherein multiple layers of conductive rigid elements bearing electronic components are stacked and interconnected by means of flexible circuits and plated through holes.

FIG. 52 shows in cross section another embodiment of the invention (5200) in a rigid flex circuit having three rigid sections (5201*a*-5201*c*) each rigid section comprised of three layers of embedded components assemblies (5204*a*, 5204*b* and 5204*c*) which are mechanically and electrically interconnected to one another by flexible circuits (5202 and 5203) and plated through holes (5211). Also identified are representative examples of embedded components (2301). In the figure, note that flexible circuit (5202) is connected to one pair of embedded component layers (5204*a* and 5204*b*) while flex circuit (5203) is connected to a different pair of embedded component layers (5204*b* and 5204*c*) exemplifying the diversity of structures possible using the basic concepts detailed in this disclosure.

A sixth and final embodiment of the present invention and process for manufacture of such are illustrated in the series of figures represented by FIG. 52-FIG. 60 which show in sequenced perspective views a method for the manufacture of a high thermal conductivity rigid flex circuit structure wherein the material used for the normally flexible center is an elastomer which capable of stretching and circuits being patterned to accommodate such stretching. Stretchable circuits are circuit form of increasing interest for certain types of products, especially those where it is desired adapt the circuit to conform to complex shapes as they move such as heart rate and/or exercise monitors. A more complete discussion of the general technology can be found in freely distributed book, Flexible Circuit Technology 4.sup.th Edition in Chapter 13 Stretchable Circuits.

Figure 53:
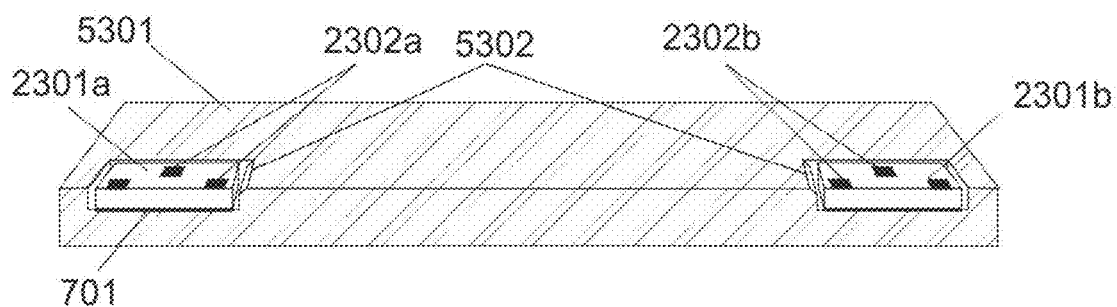
FIG. 53-60 illustrate collectively, another exemplary embodiment illustrating a process and structure for the present invention wherein the material and circuits between conductive sections are stretchable

Referring first to FIG. 53 where is provide in perspective view a first step in processing with the placement of components (2301*a*, 2301*b*) into cavities (5302) in a carrier base substrate (5301) with their terminations (2302*a*, 2302*b*) facing away from the carrier substrate. The components being held in place by an adhesive material (701)

Figure 54:

Next in FIG. 54 is a second step in processing wherein there is a coating of the components with an elastomeric material (5401) such as polyurethane, Buna N or silicone. Terminations (2302*a* and 2302*b*) on the components are shown as phantom outlines.

Figure 55:
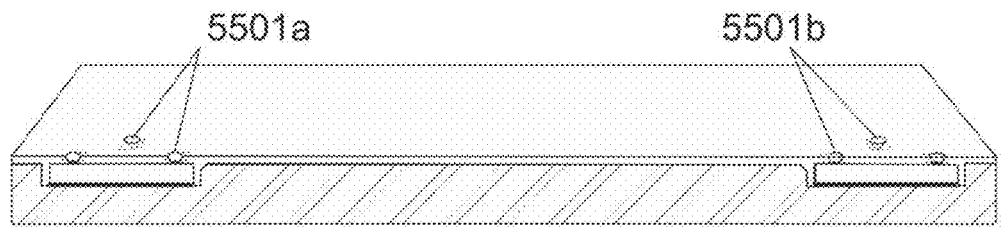

In FIG. 55 is provided in perspective view representation of a third step in processing, that of accessing the component terminations by creating vias (5501*a*, 5501*b*) in the elastomer using a method suitable for the chosen material. Lasers are best suited to most materials.

Figure 56:
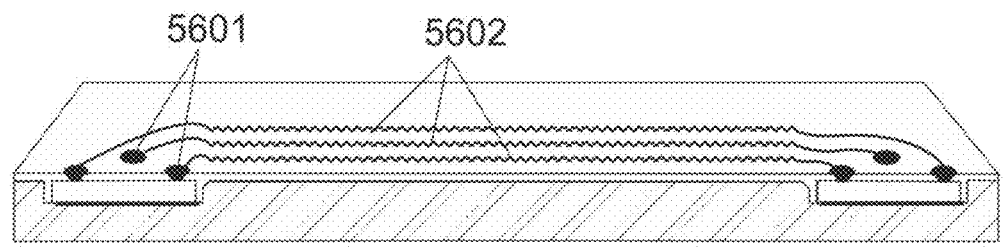

Next in FIG. 56 is shown a fourth step in processing which is actually the sum of several different steps (e.g. electroless seed metal plating, imaging and plating of the circuit pattern, removal of the resist and etching of the seed layer) which are excluded for purposes of brevity because these steps are well known by those of average skill in the art of circuit manufacture. For those with interest the entire process is described in Flexible Circuit Technology 4.sup.th Edition which serves a general reference for this disclosure and is freely available on the Internet. The non-standard feature the circuits is the sinusoidal circuit patterns (5602) which, in combination with the elastomeric base material will allow for later resilient in plane stretching of these areas. At the same time as the circuits are produce so also is plating an interconnection of the laser drilled vias (5601)

Figure 57:
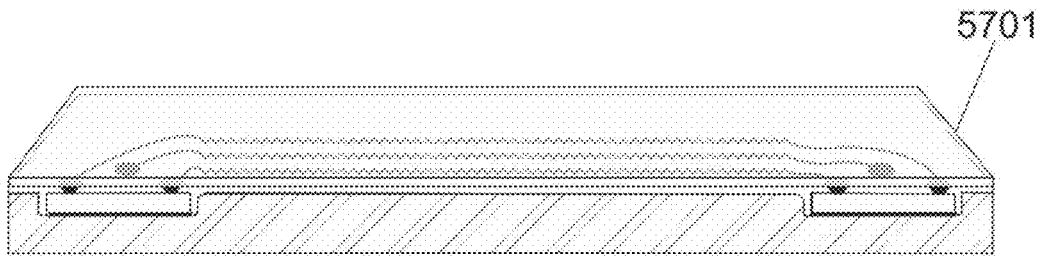

FIG. 57 offers in perspective view the next major process step wherein the circuits are over coated with a top layer of elastomeric material (5701)

Figure 58:
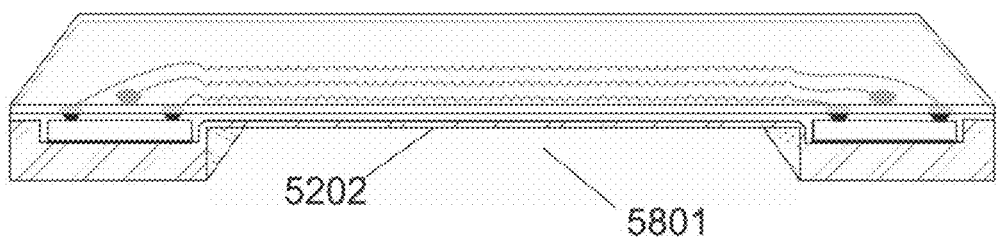

In FIG. 58 is shown an optional step where the base substrate (e.g. aluminum) is machined part way through (5801) leaving on a thin layer of the base material in tact (5202) to speed the subsequent process step of etching the base material completely away from the central area.

Figure 59:
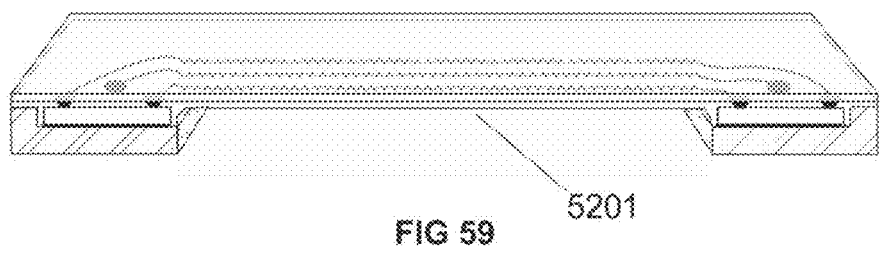

Nest in FIG. 59 is shown the assembly after and etching step is used to etch the remaining metal exposing the base elastomer (5201) and allowing the area between rigid areas to subsequently stretch when required.

Figure 60:
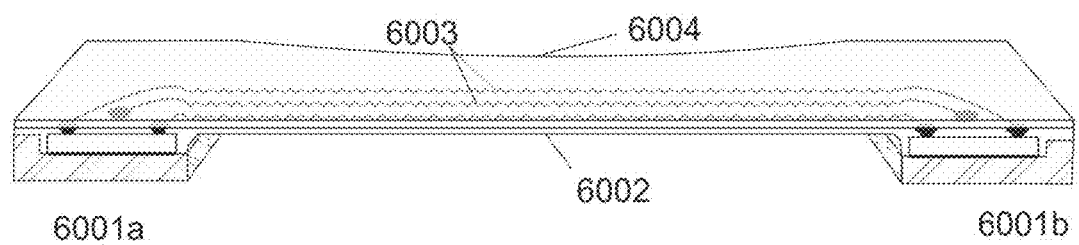

Finally in FIG. 60 is provided perspective view of a rigid stretch circuit assembly, created without the use of solder, in a stretched condition (6002) wherein the sinusoidal circuits have elongated (6003) and the elastomer has stretched narrowing in the central (6004) region of its length as the two rigid sections (6001*a*, 6001*b*) are moved apart.

Figure 61:
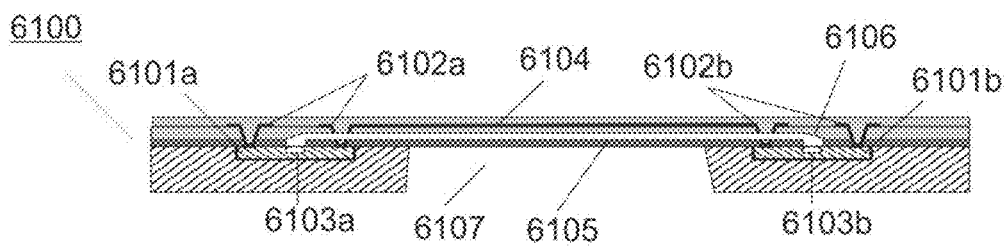
FIG. 61-62 show in cross section embodiments of the invention incorporating optical interconnections between photo optic devices and from one device to the edge of the assembly

In FIG. 61 is shown in cross section an embodiment of the invention (6100) with a gap between component bearing sections (6107) wherein photo optical components (6101*a*, 6101*b*) having both electrical contacts (6102*a*, 6102*b* respectively) and optical ports (6103*a*, 6103*b* respectively) which are interconnected by both metal circuits (6104) and an optical channel (6105) which have light redirecting surfaces (6106). The manufacturing steps are omitted for brevity, however, those skilled in the manufacturing of optical channels will be familiar with the processes required for making the optical channel and the electrical circuit processes have been described in earlier embodiments.

Figure 62:
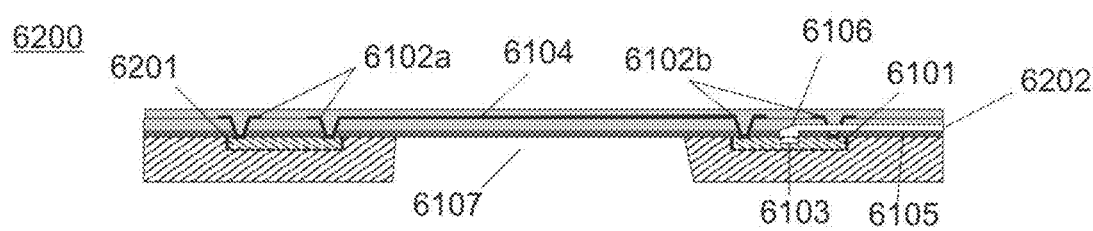

FIG. 62 shows a variation of the embodiment in FIG. 61 (6200) wherein one component 6201 is electrical and the other an optical component (6101) has an optical channel (6105) which is directed to the edge of the assembly (6202)

While various embodiments have been described above, it should be understood that they have been presented by way of example only, and that the breadth and scope of the invention should not be limited by any of the above described exemplary embodiments, but should instead be defined only in accordance with the following claims and their equivalents. By way of example, while it is believed that the elimination of interconnection means such as solder is a highly beneficial approach to manufacture of reliable electronics, those skilled in the art will note that when the assemblies are complete, it would still be possible to attach additional components to the planar surfaces if desired using any means including solder. More over while the disclosure speaks primarily to the creation of circuits in situ, it is possible to make separate modules using the concepts herein disclosed to make subassemblies and components for use in the manufacture of the assemblies described. The specification and drawings are, accordingly, to be regarded in an illustrative rather than a restrictive sense.

What is claimed is:
1. A rigid flex circuit assembly comprised of at least one rigid metal section and at least one flexible polymer material section,
   wherein the rigid metal section has at least one cavity on at least one side which holds and affixes electrically tested and burned in components-level with a surface of the rigid metal section such that component terminations are facing up from the cavity,
   said rigid metal sections having bonded to them flexible polymer material sections and having solder-free interconnections provided to the component terminations,
   and conductive circuit interconnections between rigid metal component baring sections and flexible circuit sections create a rigid flex circuit assembly without solder, wherein a thickness of the electrically tested and burned in components matches a thickness of the at least one cavity, wherein the at least one cavity comprises beveled or rounded edges, and wherein a surface of the at least one cavity is anodized aluminum or is electrophoretically coated with an insulating polymer over its surface to provide an insulating surface over its surfaces.

2. The rigid sections of the rigid flex circuit assembly of claim 1 where holes are provided to make interconnection from side to side of the assembly.

3. The rigid flex circuit assembly of claim 1 where the flexible polymer is stretchable.

4. The rigid flex circuit assembly of claim 3 where the stretchable polymer is polyurethane, Buna N or silicone polymer.

* * * * *